United States Patent [19]

Kaida

[11] Patent Number: 5,341,550

[45] Date of Patent: Aug. 30, 1994

[54] METHOD OF MANUFACTURING A PIEZOELECTRIC TUNING FORK RESONATOR

[75] Inventor: Hiroaki Kaida, Nagaokakyo, Japan

[73] Assignee: Myrata Manufacturing Co., Ltd., Japan

[21] Appl. No.: 125,018

[22] Filed: Sep. 21, 1993

Related U.S. Application Data

[62] Division of Ser. No. 64,944, May 20, 1993.

[30] Foreign Application Priority Data

| May 20, 1992 | [JP] | Japan | 4-127591 |
| Jun. 19, 1992 | [JP] | Japan | 4-161468 |
| Jun. 19, 1992 | [JP] | Japan | 4-161469 |

[51] Int. Cl.$^5$ .......................... H01L 41/22
[52] U.S. Cl. ................... 29/25.35; 310/321; 310/370
[58] Field of Search ............ 29/25.35, 407, 417; 310/321, 370

[56] References Cited

U.S. PATENT DOCUMENTS 3,766,616  10/1973  Staudte ..................... 29/25.35
4,302,694  11/1981  Fujishima et al. ......... 29/25.35 X

*Primary Examiner*—Carl E. Hall
*Attorney, Agent, or Firm*—Ostrolenk, Faber, Gerb & Soffen

[57] ABSTRACT

A piezoelectric tuning fork resonator having a piezoelectric substrate provided with a stepped portion on its end and a tuning fork arm portion formed in the stepped portion. A dummy substrate is arranged adjacent to a side of the piezoelectric substrate and a pair of sealing substrates are pasted onto upper and lower portions of the piezoelectric substrate and the dummy substrate to form a chip type piezoelectric tuning fork resonator. In another embodiment, the piezoelectric substrate includes a resin sealing portion having a hollow portion defined around the tuning fork arm portion so as to form a resin-coated piezoelectric tuning fork resonator.

8 Claims, 13 Drawing Sheets

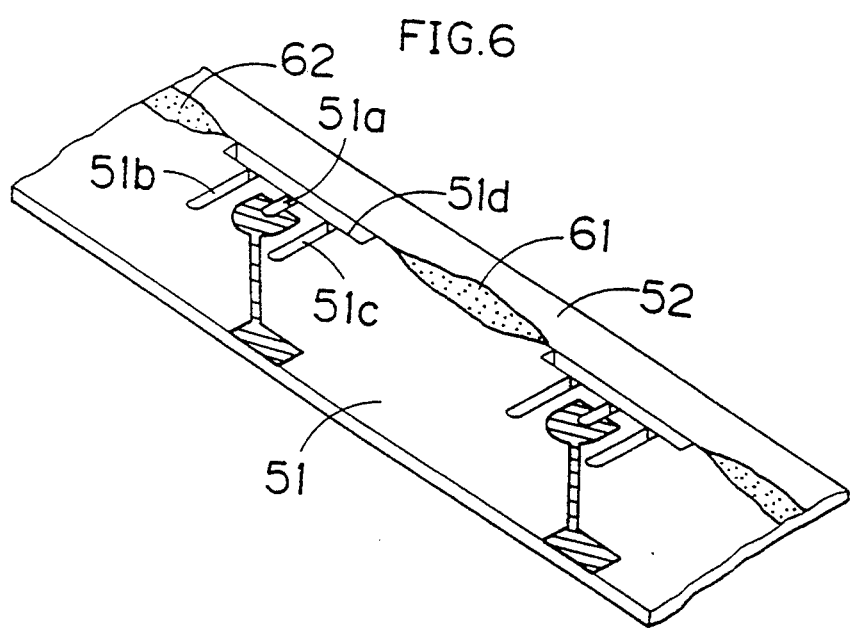

METHOD OF MANUFACTURING A PIEZOELECTRIC TUNING FORK RESONATOR

This is a division of application Ser. No. 08/064,944, filed May 20, 1993.

BACKGROUND OF THE INVENTION

1. Field of the Invention

The present invention relates to a piezoelectric tuning fork resonator and a method of manufacturing the same.

2. Description of the Background Art

As a piezoelectric tuning fork resonance component, comprising sealing substrates which are hardly spat or cracked, and a vibrating part which is excellent in air-tightness/sealability, the inventor has proposed a piezoelectric tuning fork resonance component, which is improved in portions that are provided with terminal electrodes for being electrically connected with the exterior (Japanese Utility Model Application No. 3-73941 (1991)). The structure of this piezoelectric tuning fork resonance component has not yet been opened to the public.

FIGS. 2 and 3 are an exploded perspective view and a perspective view, respectively, for illustrating such a piezoelectric tuning fork resonance component.

Referring to FIG. 2, a piezoelectric tuning fork resonator 1 comprises a piezoelectric substrate 2, which is in the form of a rectangular plate, and tuning fork grooves 2a to 2c, which are formed in the piezoelectric substrate 2 for defining a pair of tuning fork arm portions 3 and 4. In the vicinity of the innermost part of the tuning fork groove 2a, a resonance electrode 5 is formed on an upper surface of the piezoelectric substrate 2. This resonance electrode 5 is electrically connected to a lead electrode 6, which is formed on a position of the upper surface of the piezoelectric substrate 2 reaching an edge thereof. Numeral 7 denotes a dummy electrode.

On a lower surface of the piezoelectric substrate 2, another resonance electrode 8 is formed so as to be opposite to the resonance electrode 5 which is formed on the upper surface of the piezoelectric substrate 2, as shown in a downwardly projected manner. This resonance electrode 8 is electrically connected to a lead electrode 9, which is formed on the lower portion of the piezoelectric substrate 2 to reach an edge thereof. Numeral 10 denotes another dummy electrode.

A dummy substrate 11 is arranged on a side of the piezoelectric tuning fork resonator 1 with a clearance A defined between the dummy substrate 11 and the tuning fork arm portions 3 and 4. Dummy electrodes 12a and 12b are provided on an upper surface of the dummy substrate 11, while dummy electrodes 13a and 13b are provided on its lower surface, as shown in a downwardly projected manner. The dummy substrate 11, which is formed by a ceramic substrate having the same thickness as the piezoelectric substrate 2 which is arranged on its side, is provided with the dummy electrodes 12a, 12b, 13a and 13b in order to attain coincidence of the total thickness of the component.

The piezoelectric tuning fork resonator 1 is structured so as to function as a two-terminal piezoelectric vibrator upon application of alternating voltages to the lead electrodes 6 and 9.

Rectangular frame members 35 and 36, and sealing substrates 37 and 38 are stacked on upper and lower portions of the piezoelectric tuning fork resonator 1 and the dummy substrate 11 and pasted thereto with an insulating adhesive, thereby obtaining a laminate 14 shown in FIG. 3. Terminal electrodes 15 and 16, and dummy terminal electrodes 17 and 18 are provided on end surfaces of this laminate 14, thereby forming a piezoelectric tuning fork resonance component 19. The terminal electrodes 15 and 16 are formed so as to be electrically connected to the lead electrodes 6 and 9.

In this piezoelectric tuning fork resonance component, the terminal electrodes 15 and 16 are provided on end surfaces of the laminate 14, as described above, whereby the sealing substrates 37 and 38 are hardly cracked or split in handling.

While a conventional piezoelectric tuning fork resonance component has notches, which are provided on edges of sealing substrates for extracting lead electrodes and electrically connecting the same with the exterior, the aforementioned piezoelectric tuning fork resonator, which has been proposed by the inventor, is provided with no such notches. Therefore, contact areas between the piezoelectric tuning fork resonator and the sealing substrates can be increased to attain improved airtightness/sealability of the vibrating part.

Even in such a structure, however, airtightness/sealability could be occasionally damaged. When the frame members 35 and 36 and the sealing substrates 37 and 38 are stacked on upper and lower portions of the piezoelectric tuning fork resonator 1 and the dummy substrate 11, and pasted thereto with adhesives, some adhesive generally flows into the clearance A between the dummy substrate 11 and the piezoelectric tuning fork resonator 1 to maintain airtightness in the interior. However, the piezoelectric tuning fork resonance component 19 may occasionally be produced without the adhesive completely flowing into the clearance A. In such a case, airtightness/sealability is not attained.

To this end, the inventor has further proposed a piezoelectric tuning fork resonance component, which has adhesive layers provided on both sides of the tuning fork arm portions, for integrating a piezoelectric tuning fork resonator with a dummy substrate by the adhesive layers while defining a clearance between the dummy substrate and the tuning fork arm portions (Japanese Patent Application No. 4-127591 (1992)). The structure of this piezoelectric tuning fork resonance component has not yet been opened to the public either. FIG. 4 is an exploded perspective view showing such a piezoelectric tuning fork resonance component. Referring to FIG. 4, adhesive layers 41 and 42 are provided on both sides of tuning fork arm portions 3 and 4 of a piezoelectric tuning fork resonator 1, for integrating the piezoelectric tuning fork resonator 1 with a dummy substrate 11. These adhesive layers 41 and 42 are formed so that a clearance A is defined between the piezoelectric tuning fork resonator 1 and the dummy substrate 11.

Thus, it is possible to seal the clearance A between the piezoelectric tuning fork resonator 1 and the dummy substrate 11 with the adhesive layers 41 and 42, thereby improving airtightness of the overall piezoelectric tuning fork resonance component.

In the aforementioned structure, which has been proposed by the inventor, it is necessary to provide the adhesive layers 41 and 42 so that the clearance A is defined between the piezoelectric tuning fork resonator 1 and the dummy substrate 11, so as not to hinder the tuning fork arm portions 3 and 4 of the piezoelectric tuning fork resonator 1 from vibration. However, since the adhesives for forming the adhesive layers 41 and 42 are generally in the form of liquids, the tuning fork resonator 1 could be excessively integrated with the dummy substrate 11. In this case, the clearance A between the dummy substrate 11 and the piezoelectric tuning fork resonator 1 could be reduced so that the tuning fork arm portions may be hindered from vibration.

On the other hand, a method of manufacturing such a piezoelectric tuning fork resonator has the following problem:

In a general step of forming tuning fork grooves in a piezoelectric substrate, a plurality of piezoelectric substrates are superposed so that edges thereof are aligned with each other, and tuning fork grooves are simultaneously formed in the edges of the plurality of piezoelectric substrates which are superposed with each other.

In such a conventional method, however, frequency accuracy of the obtained piezoelectric tuning fork resonator is merely about ±3% with respect to a set value. Thus, a piezoelectric tuning fork resonator cannot be obtained in high frequency accuracy. In such a piezoelectric tuning fork resonator, the frequency of a vibration mode is determined by depths of the tuning fork grooves, which in turn are determined by distances from the edges of the piezoelectric substrate. In the piezoelectric substrates which are superposed with each other, however, such edges may not be accurately aligned with each other, and hence the depths of the tuning form grooves formed are dispersed in the respective piezoelectric substrates. Thus, it is impossible to attain high frequency accuracy.

In order to solve this problem, the tuning fork grooves may have to be formed in each piezoelectric substrate separately. In this case, however, productivity is extremely deteriorated.

SUMMARY OF THE INVENTION

An object of the present invention is to provide a piezoelectric tuning fork resonator having tuning fork arm portions which are not inhibited from vibration.

Another object of the present invention is to provide a method of manufacturing with excellent productivity a piezoelectric tuning fork resonator having high frequency accuracy.

The piezoelectric tuning fork resonator according to the present invention comprises a piezoelectric substrate, a step portion which is formed on an edge of the piezoelectric substrate, and a tuning fork arm portion which is formed in the step portion.

The piezoelectric tuning resonator according to the present invention may be of a chip type, or of a resin-coated lead wire type.

When the inventive piezoelectric tuning fork resonator is of a chip type, the resonator may further comprise a dummy substrate which is arranged on a side of the piezoelectric substrate, and a pair of sealing substrates which are pasted onto upper and lower portions of the piezoelectric substrate and the dummy substrate.

In the piezoelectric tuning fork resonator according to the present invention, the tuning fork arm portion is formed in the step portion, which is formed on an edge of the piezoelectric substrate. Also, when portions provided on both sides of the step portion are in contact with the dummy substrate, a clearance is reliably maintained between the tuning fork arm portion and the dummy substrate, so that the tuning fork arm portion is not hindered from vibration.

Further, it is possible to accurately maintain the clearance, which is defined between the dummy substrate and the tuning form arm portion, at a prescribed distance by assembling the piezoelectric tuning fork resonator so that the step portion is stepped at a constant distance and the portions provided on both sides of the step portion are in contact with the dummy substrate. Thus, it is possible to reduce dispersion between a plurality of such products.

In addition, it is possible to abut the dummy substrate and the piezoelectric substrate with each other for assembling a laminate, whereby manufacturing steps are simplified as compared with the prior art. In this case, the clearance between the dummy substrate and the piezoelectric substrate is narrowed so that this clearance is further reliably sealed with adhesives. Thus, the clearance is narrowed as compared with the prior art, whereby airtightness can be improved.

In the chip type piezoelectric tuning fork resonator according to the present invention, the dummy substrate may be bonded to edges of the piezoelectric substrate provided on both sides of the Step portion through adhesive layers, so that the dummy substrate is integrated with the piezoelectric substrate. When the dummy substrate is thus integrated with the piezoelectric substrate through the adhesive layers, it is possible to handle these substrates in an integrated state for assembling the chip type component, whereby workability is improved for enabling improvement in productivity.

When the inventive piezoelectric tuning fork resonator is of a lead wire type and the piezoelectric substrate is coated with a resin coating portion, a component such as wax, which is vaporized by heating, is applied to the tuning fork arm portion so that the same is not coated with resin. Such wax is vaporized by heat, which is applied to harden the resin coating portion, so as to define a hollow portion around the tuning fork arm portion. Due to provision of this hollow portion, the tuning fork arm portion is not inhibited from vibration.

In the lead wire type piezoelectric tuning fork resonator according to the present invention, the wax which is applied to the tuning fork arm portion is effectively prevented from dripping, and maintained in an excellent state by the step portion provided with the tuning fork arm portion. In this case, a piezoelectric dummy substrate may be employed. Such a dummy substrate may be bonded to edges of the piezoelectric substrate provided on both sides of the step portion through adhesive layers, for example, so that the dummy substrate is integrated with the piezoelectric substrate.

In the inventive piezoelectric tuning fork resonator, the step portion may be provided with a plurality of tuning fork arm portions.

A method of manufacturing a piezoelectric tuning fork resonator according to a first aspect of the present invention comprises the step of superposing a plurality of piezoelectric substrates while aligning edges thereof with each other, the step of cutting the edges of the piezoelectric substrates as superposed for forming cut planes serving as reference planes, and the step of forming tuning fork grooves while setting depths thereof in response to distances from the reference planes.

According to this method, the edges of the superposed piezoelectric substrates are cut to form the cut planes. These cut planes, which are formed in the superposed states of the piezoelectric substrates, are correctly aligned with each other between the superposed piezoelectric substrates. The depths of the tuning fork grooves are set in response to distances from the cut planes serving as reference planes, whereby it is possible to attain highly accurate coincidence between the depths of the tuning fork grooves formed in the respective piezoelectric substrates. Thus, dispersion of the depths of the tuning fork grooves between the piezoelectric substrates can be reduced to the minimum. Consequently, it is possible to improve frequency accuracy of the inventive piezoelectric tuning fork resonator.

A method of manufacturing a piezoelectric tuning fork resonator according to a second aspect of the present invention comprises the step of preparing a piezoelectric material block having a width capable of being sliced into a plurality of piezoelectric substrates, the step of forming grooves, which are adapted to define tuning fork grooves, upon slicing into the piezoelectric substrates, in a cross-directionally extending major surface of the piezoelectric material block, and the step of slicing the piezoelectric material block, provided with the grooves, in a direction perpendicular to the cross direction for forming piezoelectric substrates.

According to this method, the depths of the grooves for defining tuning fork grooves are set with reference to the cross-directionally extending major surface of the piezoelectric material block. In the respective piezoelectric substrates, which are obtained by slicing the piezoelectric material block, therefore, depths of the tuning fork grooves can be made to coincide with each other in high accuracy. Thus, it is possible to reduce dispersion of the depths of the tuning fork grooves between the piezoelectric substrates to the minimum, thereby improving frequency accuracy of the piezoelectric tuning fork resonator.

In this method, a step portion may be formed in the cross-directionally extending major surface of the piezoelectric material block, so that the grooves for defining tuning fork grooves are formed with reference to a cut plane of this step portion.

In this method, further, a dummy substrate block may be stacked on the piezoelectric material block through an adhesive layer so that the dummy substrate block is sliced with the piezoelectric material block.

In this method, further, the piezoelectric material block may be polarized.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a perspective view showing a state of a mother piezoelectric substrate, which is obtained through the steps shown in FIGS. 5A to 5D, abutted with a mother dummy substrate;

DESCRIPTION OF THE PREFERRED EMBODIMENTS

Figure 1:
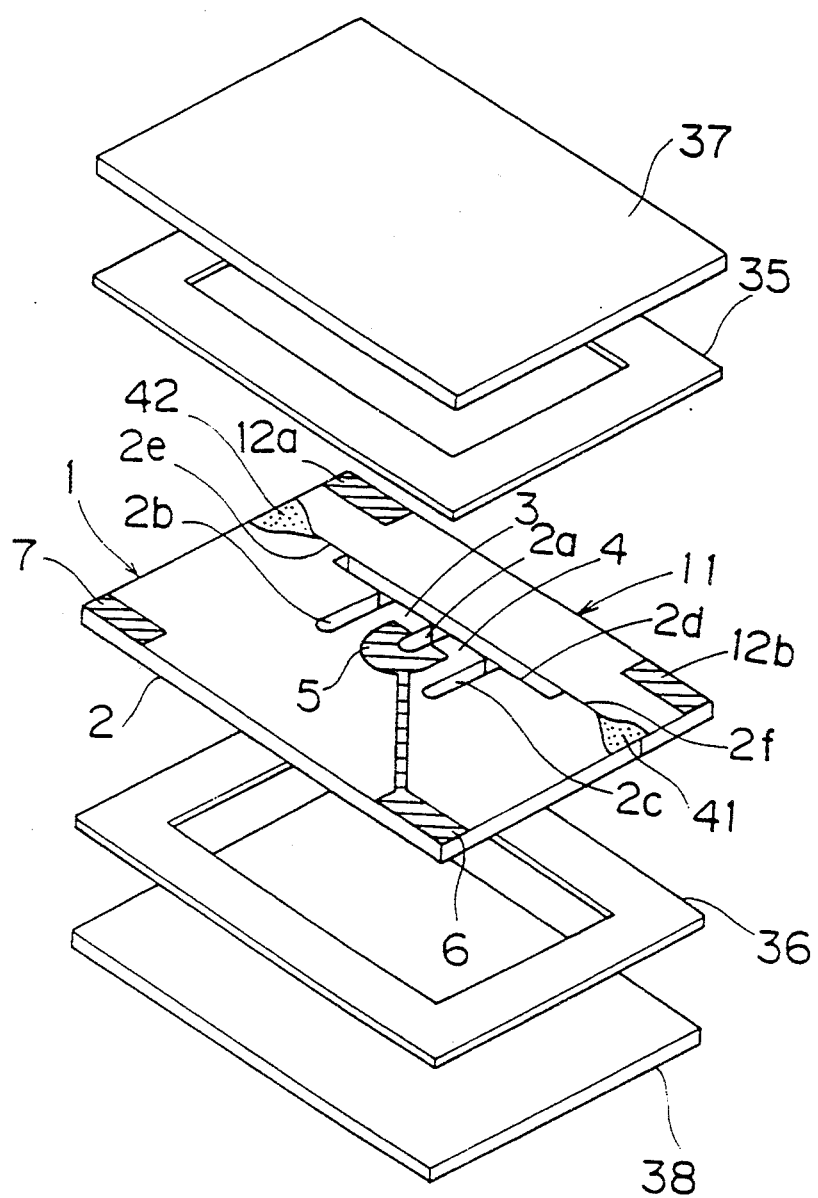
FIG. 1 is an exploded perspective view showing a piezoelectric tuning fork resonator according to an embodiment of the present invention.

FIG. 1 is an exploded perspective view showing an embodiment of the present invention. Referring to FIG. 1, a piezoelectric substrate 2 is provided with an inwardly depressed step portion 2d, which is formed in a central portion of an edge facing a dummy substrate 11. Tuning fork grooves 2a to 2c are formed in this step portion 2d, thereby defining a pair of tuning fork arm portions 3 and 4. Due to such provision of the tuning fork arm portions 3 and 4 defined in the step portion 2d, both side portions of the edge of the piezoelectric substrate 2 holding the tuning fork arm portions 3 and 4 project toward the dummy substrate 11, to define projecting portions 2e and 2f. These projecting portions 2e and 2f are abutted with a side surface of the dummy substrate 11, with adhesive layers 41 and 42 which are provided between the same.

Figure 2:
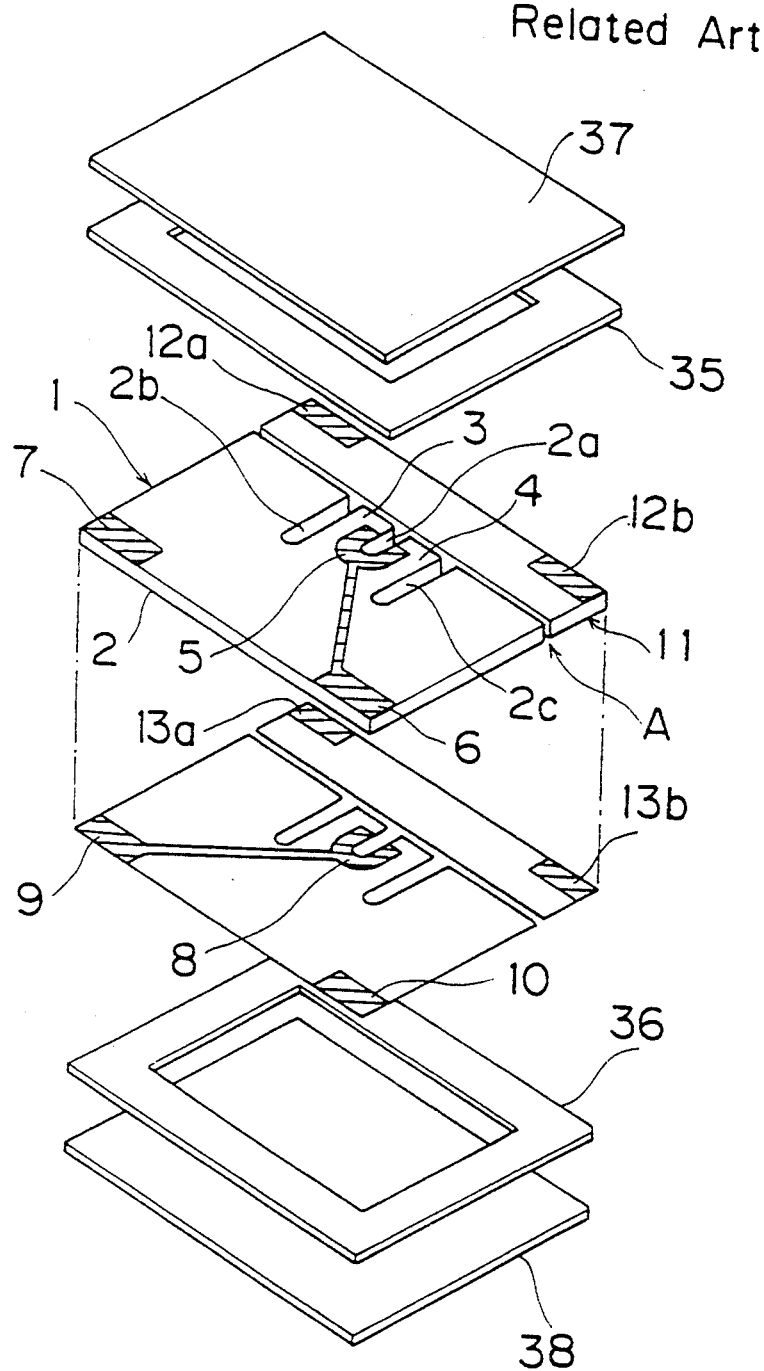
FIG. 2 is an exploded perspective view showing a laminate for forming a piezoelectric resonator according to a related technique.

Frame members 35 and 36 and sealing substrates 37 and 38 are stacked on upper and lower portions of the piezoelectric substrate 2 and the dummy substrate 11 which are integrated with each other in the aforementioned manner, and pasted thereto by adhesives, to define a laminate. Other components of this embodiment, which are similar to those shown in FIG. 2, are denoted by the same reference numerals, to omit redundant description.

Figure 3:
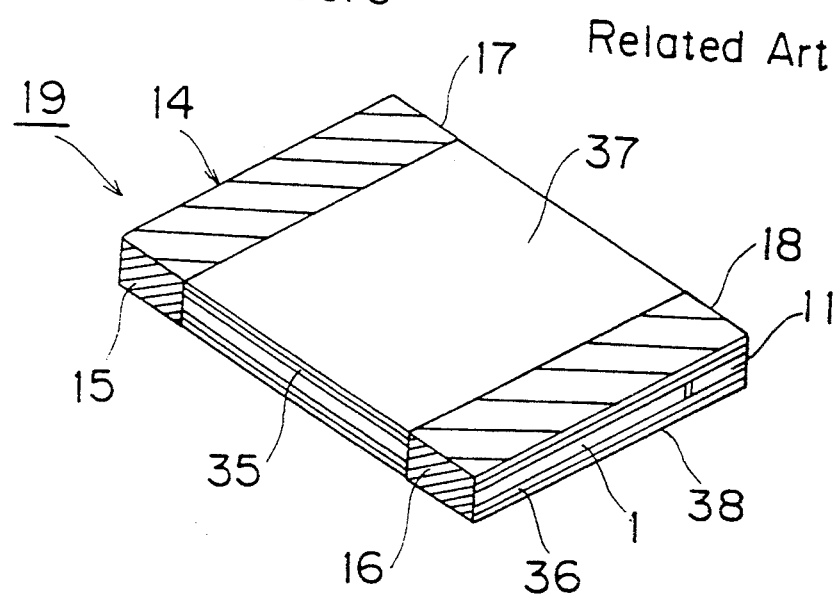
FIG. 3 is a perspective view showing a laminate for forming a piezoelectric tuning fork resonator according to a related technique which is similar to that shown in FIG. 2.
Figure 4:
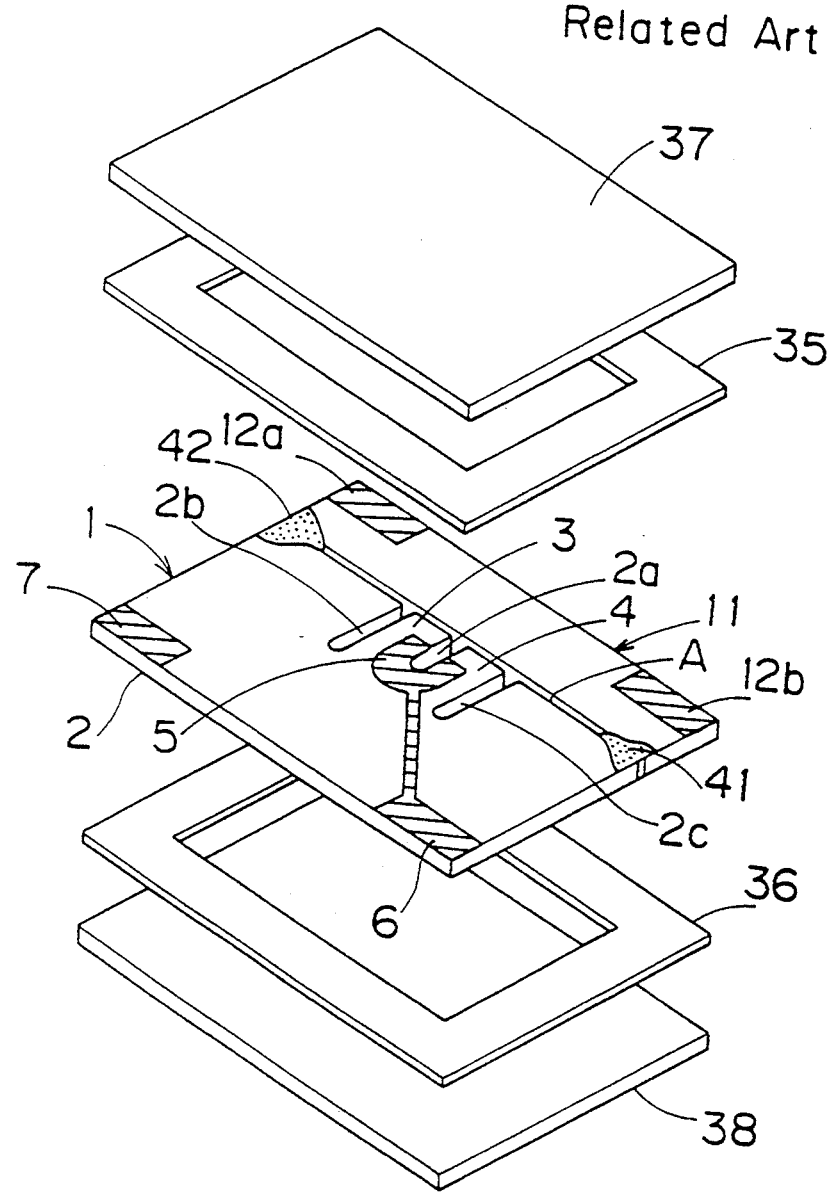
FIG. 4 is an exploded perspective view showing a laminate for forming a piezoelectric tuning fork resonator according to another related technique.

The laminate obtained in the aforementioned manner can be provided with terminal electrodes on end surfaces thereof, as shown in FIG. 3, to form a piezoelectric tuning fork resonance component.

In the piezoelectric tuning fork resonance component according to this embodiment of the present invention, a sufficient clearance is maintained between the dummy substrate 11 and the tuning fork arm portions 3 and 4, whereby the tuning fork arm portions 3 and 4 are not hindered from vibration. When the laminate is assembled, the dummy substrate 11 and the piezoelectric substrate I can be integrated with each other through the adhesive layers 41 and 42, whereby workability is improved for enabling improvement in productivity. The projecting portions 2e and 2f of the piezoelectric substrate 1 are abutted with the dummy substrate 11 so that these substrates are integrated with each other through the adhesive layers 41 and 42, whereby the clearance between the piezoelectric substrate 1 and the dummy substrate 11 is reliably sealed with the adhesive layers 41 and 42, to attain higher airtightness in the overall piezoelectric tuning fork resonance component.

In the aforementioned embodiment, the adhesive layers are previously formed between the piezoelectric substrate and the dummy substrate so that the sealing substrates etc. are then stacked on these substrates. However, the inventive piezoelectric tuning fork resonance component is not restricted to the aforementioned structure having the adhesive layers previously formed between the piezoelectric substrate and the dummy substrate, but the present invention is also applicable to a component which is manufactured by a method of abutting a piezoelectric substrate with a dummy substrate, stacking frame members and sealing substrates on upper and lower portions of the substrates and pasting the same with adhesives. Since the adhesive which is employed for pasting the frame members and the sealing substrates naturally flows into a clearance defined between the dummy substrate and the piezoelectric substrate in this case, the dummy substrate and the piezoelectric substrate can be abutted so as to be in contact with each other, whereby substantially no or only a small clearance is defined between the substrates. Thus, there is no need for a large amount of adhesive to flow into this clearance and the clearance can be further reliably sealed with the adhesive, to improve internal airtightness.

An embodiment of a method according to the first aspect of the present invention is now described.

Figure 5A:
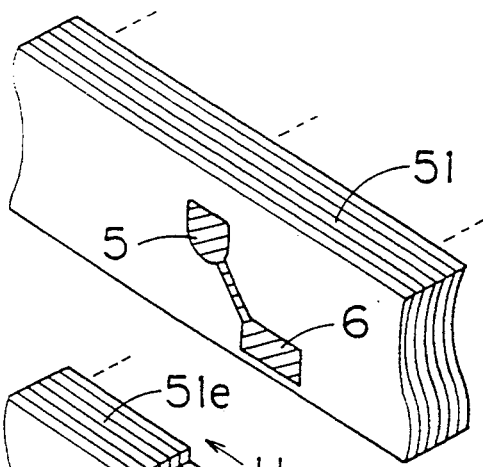
FIG. 5A is a perspective view showing a manufacturing step in an embodiment of a method according to a first aspect of the present invention, in a state not yet provided with a step portion.

Referring to FIG. 5A, a plurality of piezoelectric substrates 51 are superposed so that edges thereof are aligned with each other, and retained in a holder. A resonance electrode 5 is previously provided in a portion of each piezoelectric substrate 51, which are to be provided with a tuning fork groove, and a lead electrode 6 extends from this resonance electrode 5. Wax is applied to edges of the superposed piezoelectric substrates 51 and solidified, to fix the piezoelectric substrates 51. The superposed piezoelectric substrates 51 may be mechanically fixed by a jig.

Figure 5B:
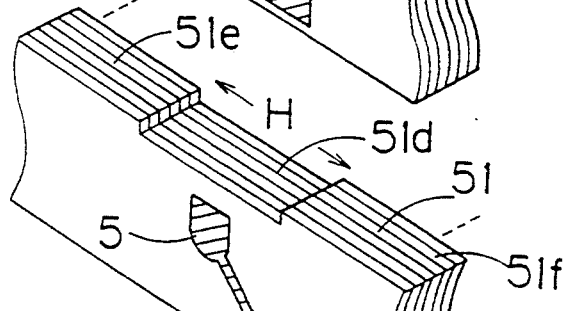
FIG. 5B is a perspective view showing a manufacturing step in the embodiment of the method according to the first aspect of the present invention, in a state provided with the step portion.

Referring to FIG. 5B, regions of the edges of the piezoelectric substrates 51, which are to be provided with tuning fork grooves, are cut with a peripheral cutting edge having a width H. Thus, step portions 51d, are formed so that portions provided on both sides of the step portions 51d project to define projecting portions 51e and 51f.

Figure 5C:
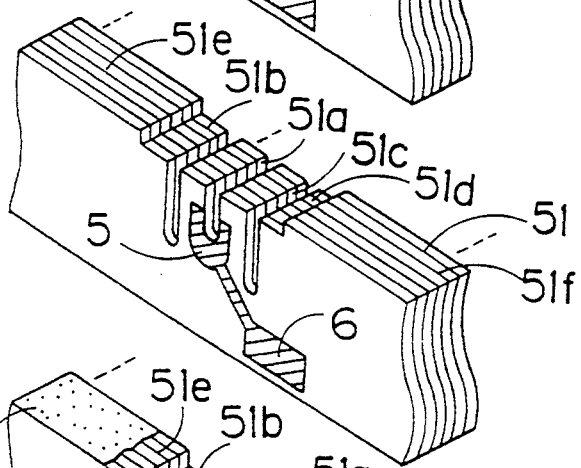
FIG. 5C is a perspective view showing a manufacturing step in the embodiment of the method according to the first aspect of the present invention, in a state provided with tuning fork grooves in the step portion.

Referring to FIG. 5C, tuning fork grooves 51a to 51c are formed in the step portions 51d, to define pairs of tuning fork arm portions. The central tuning fork grooves 51a are formed so that forward ends thereof reach the resonance electrodes 5. Frequencies of vibrating parts of the formed piezoelectric tuning fork resonators are determined by depths of the tuning fork grooves 51a, i.e., distances between the step portions 51d and the forward ends of the tuning fork grooves 51a. The cut planes of the step portions 51d and the forward ends of the tuning fork grooves 51a are formed after the piezoelectric substrates 51 are superposed with each other and fixed to the holder, whereby substantially no dispersion is caused between the depths of the tuning fork grooves 51a in the respective piezoelectric substrates 51.

Thus, it is possible to obtain piezoelectric tuning fork resonators having desired frequencies using the piezoelectric substrates 51 having the tuning fork grooves 51a to 51c formed in the aforementioned manner, thereby extremely improving frequency accuracy of the piezoelectric tuning fork resonators.

Figure 5D:
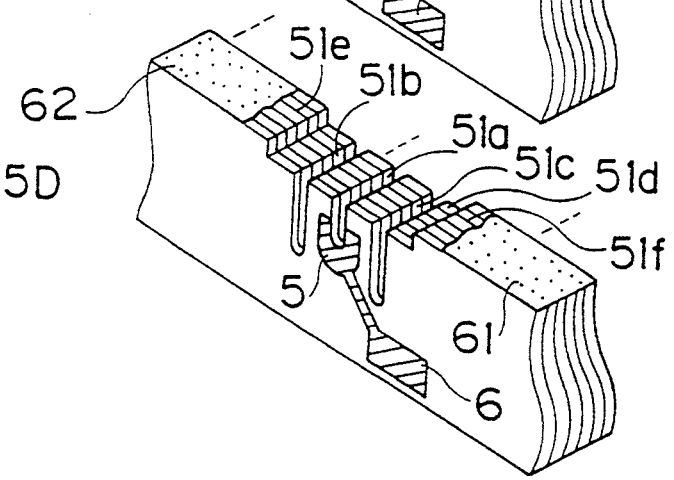
FIG. 5D is a perspective view showing a manufacturing step in the embodiment of the method according to the first aspect of the present invention, in a state provided with adhesives applied to both sides of the step portion.

According to this embodiment, the edges of the piezoelectric substrates 51 provided with the tuning fork grooves 51a to 51c are coated with adhesives, and then abutted with side surfaces of dummy substrates. As shown in FIG. 5D, therefore, the wax adhering to the projecting portions 51e and 51f of the piezoelectric substrates 51 is washed out and thereafter adhesives 61 and 62 are applied onto these portions 51e and 51f.

Figure 7:
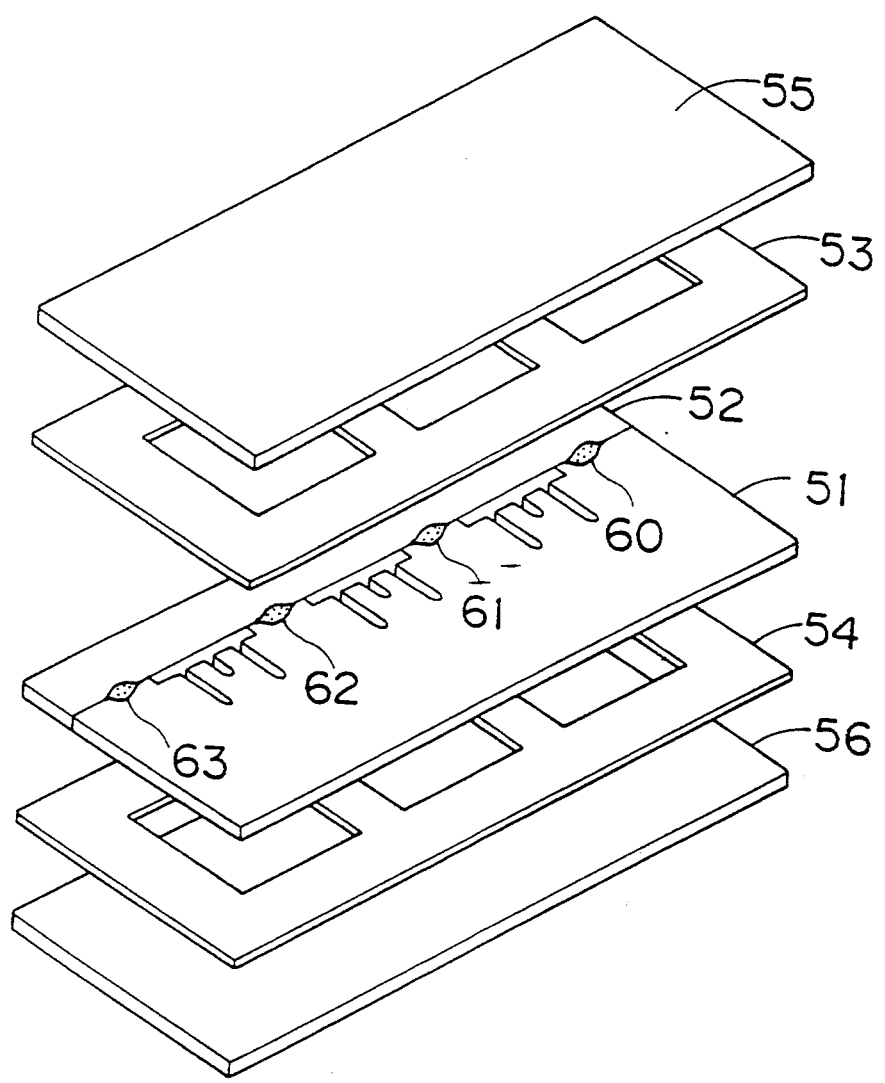
FIG. 7 is a perspective view showing frame members and sealing substrates to be stacked on upper and lower portions of the mother piezoelectric substrate and the mother dummy substrate integrated by the adhesives, shown in FIG. 6.
Figure 8:
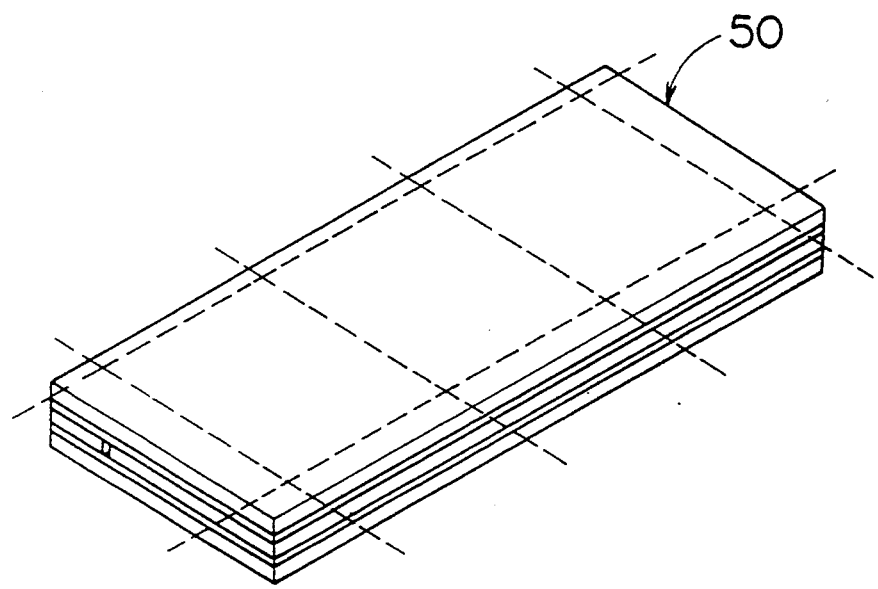
FIG. 8 is a perspective view for illustrating the step of cutting a laminate obtained by stacking the mother substrates.

Referring to FIG. 6, each piezoelectric substrate 51, which is coated with the adhesives 61 and 62 on its side surface, is abutted and integrated with a side surface of a dummy substrate 52. Referring to FIG. 7, frame members 53 and 54 and sealing substrates 55 and 56 are stacked on upper and lower portions of the piezoelectric substrate 51 and the dummy substrate 52 which are thus integrated with each other, and pasted thereto by adhesives. Numerals 60 to 63, appearing in FIG. 7, denote adhesive layers for pasting the piezoelectric substrate 51 with the dummy substrate 52. FIG. 8 shows a laminate 50 obtained in the aforementioned manner. This laminate 50 is cut along broken lines shown in FIG. 8, to obtain laminates for forming three piezoelectric tuning fork resonance components.

While the tuning fork grooves are formed after the cut planes are formed by cutting the edges of the piezoelectric substrates in the embodiment shown in FIGS. 5A to 5D, such formation of the tuning fork grooves and cutting of the edges of the piezoelectric substrates may be carried out in reverse order. In other words, the tuning fork grooves may be first formed in the edges of the superposed piezoelectric substrates, and the edges may thereafter be cut to form cut planes. Also when the steps are thus reversed, the depths of the tuning fork grooves are set by the distances between the cut planes serving as reference planes and the forward ends of the tuning fork grooves, whereby it is possible to reduce dispersion between the depths of the tuning grooves in the piezoelectric substrates.

200 samples of the piezoelectric tuning fork resonance component according to this embodiment were prepared and subjected to measurement of tuning fork frequency accuracy. The result was ±0.5% of the desired frequency.

For the purpose of comparison, piezoelectric tuning fork resonance components manufactured by a conventional method were also subjected to measurement of frequency accuracy. The result was ±3% of the desired frequency. Thus, it is clearly understood that tuning fork frequency accuracy can be extremely improved according to the present invention.

Figure 9:
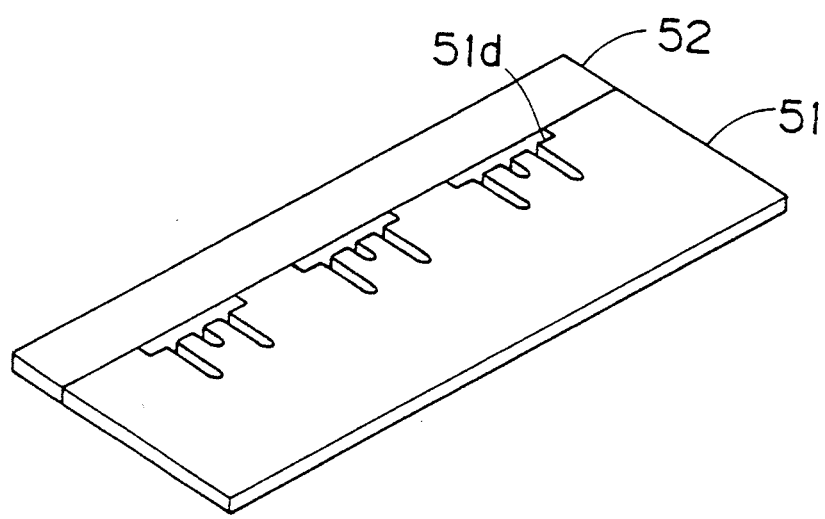
FIG. 9 is a perspective view showing a mother piezoelectric substrate and a mother dummy substrate which are abutted with each other with no integration through adhesives.

While in the aforementioned embodiment the piezoelectric substrate is integrated with the dummy substrate through the adhesive layers, and the frame members and the sealing substrates are thereafter stacked on upper and lower portions of the substrates, the present invention is not restricted to such a structure of previously integrating the piezoelectric substrate with the dummy substrate through the adhesive layers. Alternatively, a mother piezoelectric substrate 51 may be abutted with a mother dummy substrate 52, as shown in FIG. 9, and the frame members and sealing substrates may then be stacked on upper and lower portions thereof and pasted, as shown in FIG. 8, for example. In this case, a clearance between the piezoelectric substrate 51 and the dummy substrate 52 is sealed with adhesives employed for pasting the frame members and sealing substrates.

Figure 10:
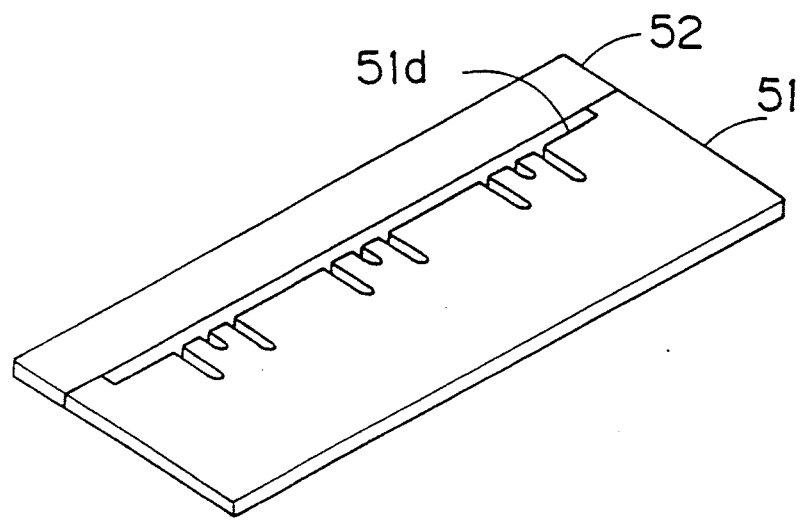
FIG. 10 is a perspective view showing an embodiment having three tuning fork groove portions formed in a single step portion.

Further, while in the aforementioned embodiments single resonance parts are provided in the step portions formed by cutting the edges of the piezoelectric substrates, the present invention is not restricted to such a structure but a plurality of resonance parts may be formed in each step portion. FIG. 10 shows such an embodiment wherein three pairs of tuning fork arm portions are formed in a step portion 51d of a mother piezoelectric substrate 51. Also in this embodiment, frame members and sealing substrates can be stacked on upper and lower portions of the mother piezoelectric substrate 51 and a mother dummy substrate 52 and pasted thereto so that the formed laminate can be cut to obtain a single resonance component.

Figure 11:
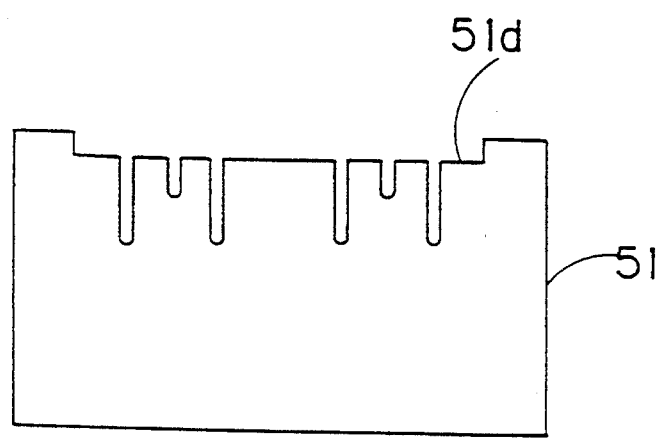
FIG. 11 is a front elevational view showing an embodiment having two tuning fork groove portions formed in a single step portion.

Alternatively, two pairs of tuning fork arm portions may be formed in a step portion 51d of a piezoelectric substrate 51, as shown in FIG. 11. When two pairs of tuning fork arm portions are thus formed in a single piezoelectric substrate, the formed piezoelectric tuning fork resonator can be applied to a filter, for example.

While the edges of the piezoelectric substrates are partially cut to define the step portions in the aforementioned embodiments, the method of forming the step portions is not restricted to this approach in the method according to the first aspect of the present invention. Alternatively, overall edges of the piezoelectric substrates may be cut so that depths of tuning fork grooves are set with reference to the formed cut planes.

Figure 12:
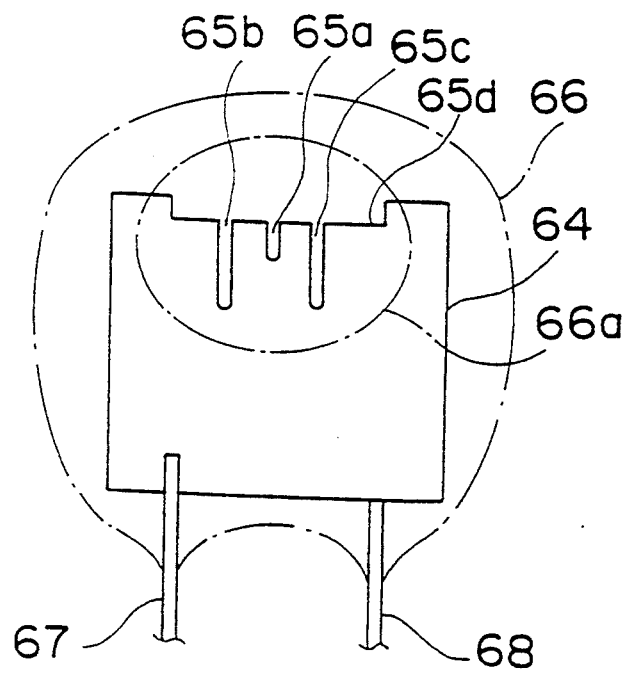
FIG. 12A is a front elevational view showing an exemplary piezoelectric tuning fork resonator of a lead wire type according to the present invention.
FIG. 12B is a front elevational view showing another exemplary piezoelectric tuning fork resonator of a lead wire type according to the present invention.
Figure 12:
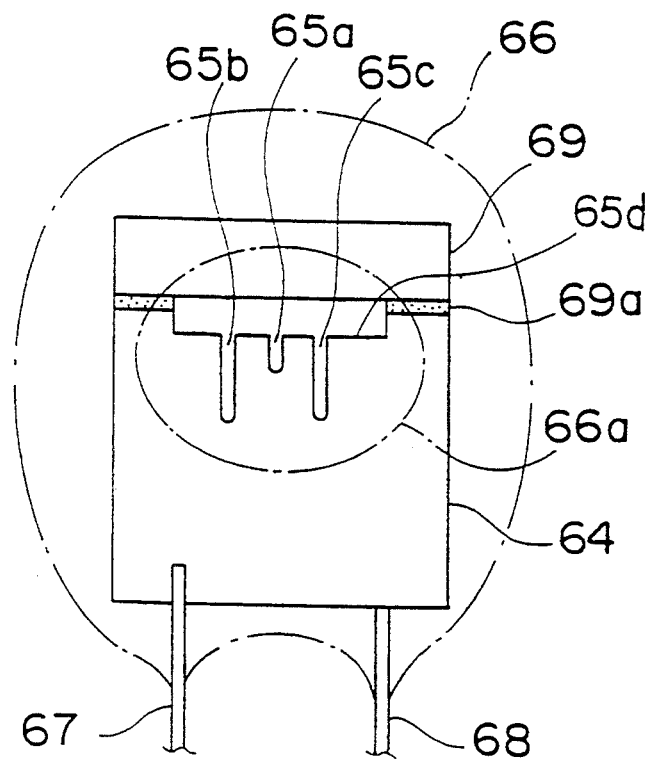

FIGS. 12A and 12B are front elevational views showing lead wire type piezoelectric tuning fork resonators according to the present invention.

Referring to FIG. 12A, a step portion 65d is formed on an edge of a piezoelectric substrate 64, and three tuning fork grooves 65a, 65b and 65c are formed in the step portion 65d to define tuning fork arm portions. Lead wires 67 and 68, which are connected to a resonance electrode (not shown), are mounted on the piezoelectric substrate 64. Such a piezoelectric tuning fork resonator is dipped in thermosetting resin so as to be provided with a resin coating portion 66 which covers the piezoelectric substrate 64. At this time, wax is generally applied to the tuning fork arm portions so that these portions are not filled up with the resin. Thereafter the piezoelectric tuning fork resonator is dipped in the resin so as to be coated with this resin, which in turn is hardened by heating. Referring to FIG. 12A, a hollow portion 66a is defined around the tuning fork arm portions due to such application of the wax. Thus, the tuning fork arm portions can vibrate without restraint by the resin. According to the present invention, the wax applied can be maintained in an excellent state due to formation of the step portion 65d. Thus, the hollow portion 66a can be reliably defined around the tuning form arm portions by the wax.

When a dummy substrate 69 is provided on a piezoelectric substrate 64 through adhesive layers 69a as shown in FIG. 12B, wax can be maintained in a further excellent state.

An embodiment of a method according to the second aspect of the present invention is now described.

Figure 13A:
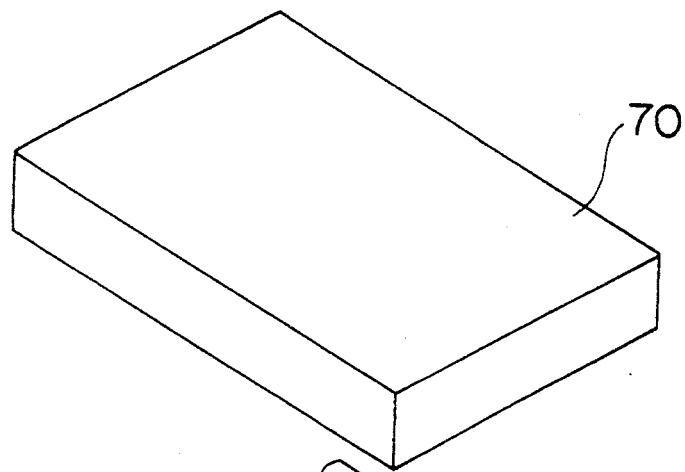
FIG. 13A is a perspective view showing a manufacturing step in an embodiment of a method according to a second aspect of the present invention, in a state not yet provided with a step portion in a piezoelectric material block.

Referring to FIG. 13A, a piezoelectric material block 70 is polarized along arrow P.

Figure 13B:
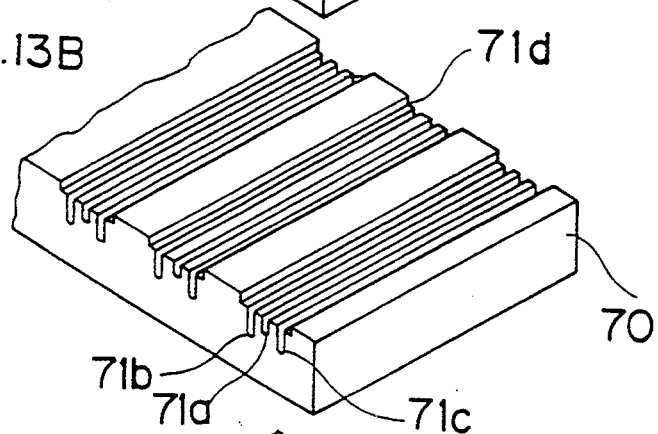
FIG. 13B is a perspective view showing a manufacturing step in the embodiment of the method according to the second aspect of the present invention, in a state provided with a step portion and tuning fork groove portions formed therein.

Referring to FIG. 13B, step portions 71d are formed on a major surface of the piezoelectric material block 70. Then, grooves 71a, 71b and 71c are formed in the respective step portions 71d. These grooves 71a, 71b and 71c are adapted to define tuning fork grooves after the piezoelectric material block 70 is sliced, as shown in FIG. 13C.

Figure 13C:
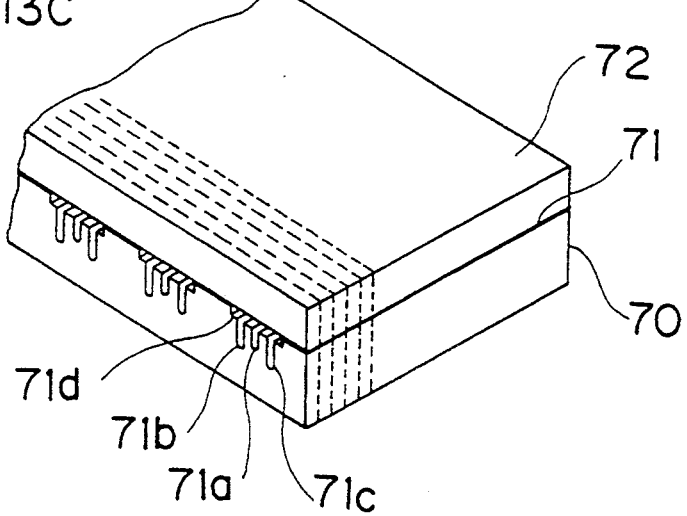
FIG. 13C is a perspective view showing a manufacturing step in the embodiment of the method according to the second aspect of the present invention, in a state provided with a dummy substrate block superposed on the piezoelectric material block through adhesive layers.

Referring to FIG. 13C, adhesives are applied onto projecting portions, which are defined on both sides of the step portions 71d of the piezoelectric material block 70, to form adhesive layers 71, and a dummy substrate block 72 is stacked thereon. Then, the piezoelectric material block 70 is sliced with the dummy substrate block 72 along dotted lines, to obtain bars of piezoelectric substrates provided with dummy substrates through adhesive layers.

Figure 14:
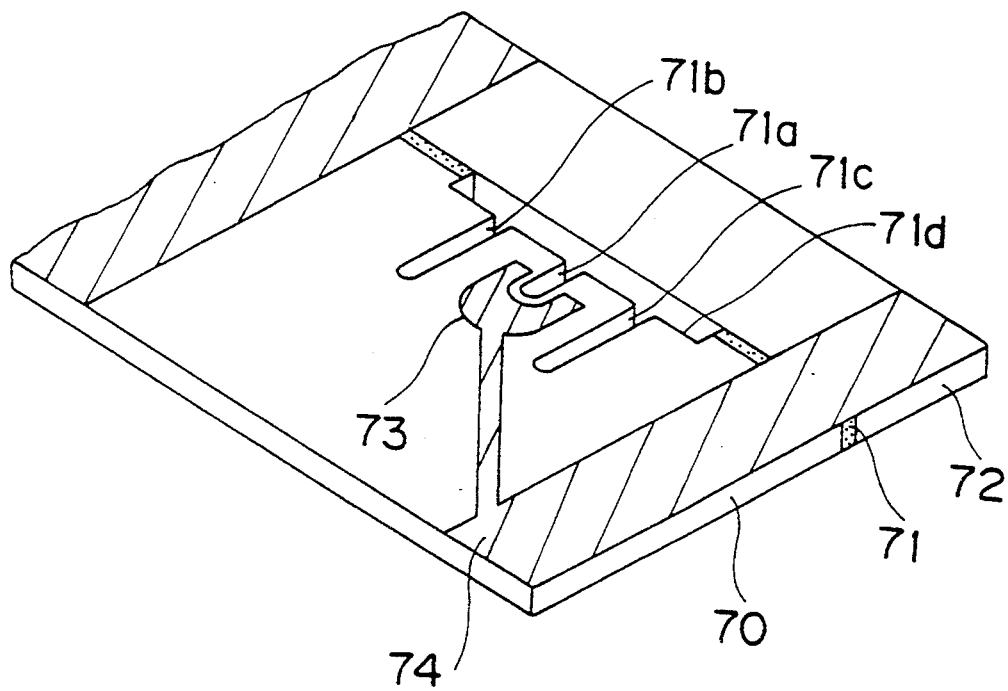
FIG. 14 is a perspective view showing electrodes formed on a piezoelectric substrate and a dummy substrate which are obtained by slicing the piezoelectric material block and the dummy substrate block shown in FIG. 13C.

FIG. 14 is a perspective view showing each bar of the piezoelectric substrate obtained in the aforementioned manner, in a state provided with electrodes. A resonance electrode 73 is formed in the innermost portion of a tuning fork groove 71a, while a lead electrode 74 is electrically connected to this resonance electrode 73.

Figure 15:
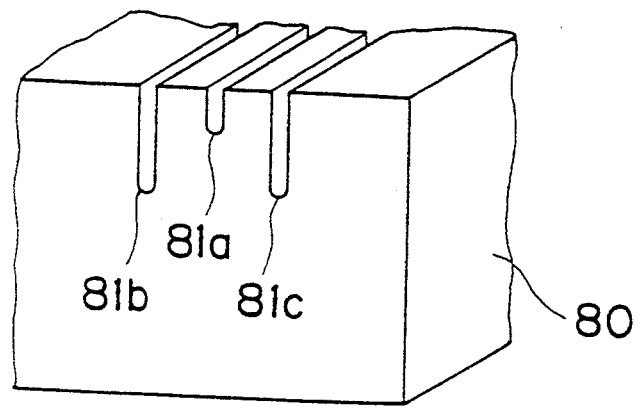
FIG. 15 is a perspective view for illustrating a manufacturing step in another embodiment of the method according to the second aspect of the present invention, in a state provided with tuning fork groove portions directly formed in a piezoelectric material block with no step portion.
Figure 16:
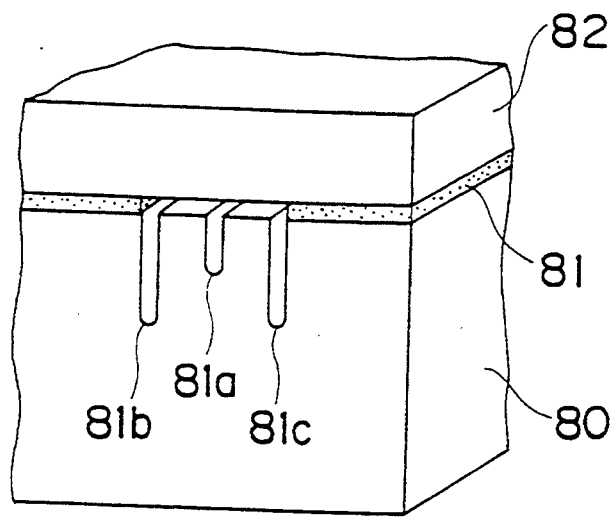
FIG. 16 is a perspective view showing a dummy substrate block superposed through adhesive layers on the piezoelectric material block shown in FIG. 15 through adhesive layers.
Figure 17:
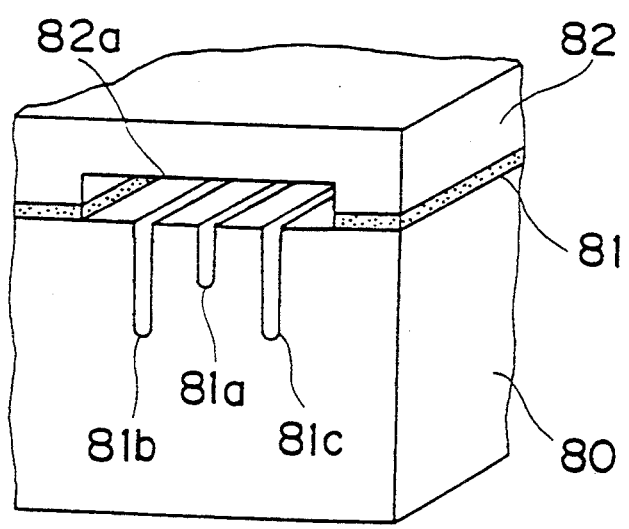
FIG. 17 is a perspective view showing a dummy substrate, provided with a step portion, superposed on the piezoelectric material block shown in FIG. 15.

FIGS. 15 to 17 are perspective views showing another embodiment of the method according to the second aspect of the present invention. Referring to FIG. 15, grooves 81a, 81b and 81c for defining tuning fork grooves are directly formed in a major surface of a piezoelectric material block 80 having no step portion. Thereafter adhesives are applied to remaining regions excluding the grooves 81a to 81c to form adhesive layers 81 (as shown in FIG. 16), and a dummy substrate block 82 is placed on these adhesive layers 81. Tuning fork arm portions defined by the grooves 81a to 81c can be prevented from being in contact with the dummy substrate block 82 by the thickness of the adhesive layers 81.

Referring to FIG. 17, a dummy substrate block 82 provided with a step portion 82a is stacked on the piezoelectric material block 80 shown in FIG. 15. The step portion 82a may be formed in the dummy substrate block 82 when the adhesive layers 81 are reduced in thickness so as to prevent the dummy substrate block 82 from coming in contact with the tuning fork arm portions.

According to the present invention, as hereinabove described, it is not necessarily required to provide the step portion in the piezoelectric material block but an accurate plane may be formed on a major surface of the piezoelectric material block by lapping or the like, for example, so that tuning fork grooves can be formed in respective piezoelectric substrates with no dispersion between the depths thereof.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a piezoelectric tuning fork resonator by forming tuning fork grooves in a piezoelectric substrate, said method comprising the steps of:
   superposing a plurality of piezoelectric substrates while aligning edges thereof with each other;
   cutting said edges of said superposed piezoelectric substrates for defining cut planes; and
   forming tuning fork grooves while setting depths of said tuning fork grooves as measured from said cut planes.

2. A method in accordance with claim 1, wherein indentations are formed extending inwardly from said edges of said piezoelectric substrates by said cutting step.

3. A method in accordance with claim 2, wherein the step of forming said indentations includes the step of forming a plurality of tuning fork grooves in each of said indentations.

4. A method in accordance with claim 2, wherein said indentations are formed at a central part of said edges of said superposed piezoelectric substrates whereby portions of said edges are located on both sides of said indentations, and further comprising the step of applying adhesives onto said portions of said edges of said superposed piezoelectric substrates.

5. A method of manufacturing a piezoelectric tuning fork resonator using a piezoelectric substrate provided with tuning fork grooves in end thereof, said method comprising the steps of:
   preparing a piezoelectric material block having a width capable of being sliced into a plurality of piezoelectric substrates;
   forming grooves in a cross-directionally extending major surface of said piezoelectric material block for providing tuning fork grooves upon slicing said piezoelectric block into said piezoelectric substrates; and
   slicing said piezoelectric material block, provided with said grooves, in a direction perpendicular to said cross direction for forming said piezoelectric substrates.

6. A method in accordance with claim 5, further comprising the step of forming an indentation extending inwardly from said cross-directionally extending major surface of said piezoelectric material block, said grooves being formed in said indentation.

7. A method in accordance with claim 5, further comprising the step of stacking a dummy substrate block so as to be connected through adhesive layers with said piezoelectric material block provided with said grooves, said step of slicing said piezoelectric material block comprising the step of slicing said dummy substrate block, stacked on said piezoelectric material block, with said piezoelectric material block.

8. A method in accordance with claim 5, further comprising the step of polarizing said piezoelectric material block.

* * * * *

UNITED STATES PATENT AND TRADEMARK OFFICE
CERTIFICATE OF CORRECTION

PATENT NO. : 5,341,550
DATED : August 30, 1994
INVENTOR(S) : Hiroaki KAIDA It is certified that error appears in the above-identified patent and that said Letters Patent is hereby corrected as shown below:

On the title page, item [73]:

Assignee: Myrata Manufacturing Co., Ltd., Japan"

to

Assignee: Murata Manufacturing Co., Ltd., Japan--

Signed and Sealed this

Twenty-fifth Day of July, 1995

*Attest:*

BRUCE LEHMAN

*Attesting Officer*      *Commissioner of Patents and Trademarks*